United States Patent
Naaman et al.

(10) Patent No.: US 10,042,805 B2
(45) Date of Patent: Aug. 7, 2018

(54) TUNABLE BUS-MEDIATED COUPLING BETWEEN REMOTE QUBITS

(71) Applicants: Ofer Naaman, Ellicott City, MD (US); Zachary Kyle Keane, Baltimore, MD (US); Micah Stoutimore, Kensington, MD (US); David George Ferguson, Takoma Park, MD (US)

(72) Inventors: Ofer Naaman, Ellicott City, MD (US); Zachary Kyle Keane, Baltimore, MD (US); Micah Stoutimore, Kensington, MD (US); David George Ferguson, Takoma Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 269 days.

(21) Appl. No.: 15/003,232

(22) Filed: Jan. 21, 2016

(65) Prior Publication Data
US 2017/0212860 A1 Jul. 27, 2017

(51) Int. Cl.
| *G06F 13/38* | (2006.01) |
| *G06F 13/40* | (2006.01) |
| *H01L 39/02* | (2006.01) |
| *H01L 39/22* | (2006.01) |
| *G06N 99/00* | (2010.01) |

(52) U.S. Cl.
CPC ...... *G06F 13/4027* (2013.01); *G06F 13/4068* (2013.01); *G06N 99/002* (2013.01); *H01L 39/025* (2013.01); *H01L 39/223* (2013.01)

(58) Field of Classification Search
None
See application file for complete search history.

(56) References Cited

U.S. PATENT DOCUMENTS 7,135,701 B2 * 11/2006 Amin .................... B82Y 10/00
257/31
7,613,764 B1 11/2009 Hilton et al.
(Continued)

FOREIGN PATENT DOCUMENTS

WO 2014028302 A2 2/2014

OTHER PUBLICATIONS

Majer, J., et al. "Coupling superconducting qubits via a cavity bus." *Nature* 449.7161 (2007): 443-447.
(Continued)

*Primary Examiner* — Cheng-Yuan Tseng
(74) *Attorney, Agent, or Firm* — Tarolli, Sundheim, Covell & Tummino LLP

(57) ABSTRACT

A tunable bus-mediated coupling system is provided that includes a first input port coupled to a first end of a variable inductance coupling element through a first resonator and a second input port coupled to a second end of the variable inductance coupling element through a second resonator. The first input port is configured to be coupled to a first qubit, and the second output port is configured to be coupled to a second qubit. A controller is configured to control the inductance of the variable inductance coupling element between a low inductance state to provide strong coupling between the first qubit and the second qubit and a high inductance state to provide isolation between the first qubit and the second qubit.

20 Claims, 4 Drawing Sheets

(56) References Cited

U.S. PATENT DOCUMENTS

| | | | |
|---|---|---|---|
| 8,536,566 B2* | 9/2013 | Johansson | B82Y 10/00 |
| | | | 257/31 |
| 9,379,303 B2* | 6/2016 | Gambetta | G06N 99/002 |
| 9,438,246 B1* | 9/2016 | Naaman | H03K 19/195 |
| 9,503,063 B1* | 11/2016 | Abraham | H03K 3/38 |
| 9,647,662 B1* | 5/2017 | Abutaleb | H03K 19/017545 |
| 9,787,312 B2* | 10/2017 | Herr | H03K 19/1954 |
| 2005/0001209 A1 | 1/2005 | Hilton et al. | |
| 2008/0238531 A1* | 10/2008 | Harris | B82Y 10/00 |
| | | | 327/528 |
| 2010/0148853 A1 | 6/2010 | Harris et al. | |
| 2014/0235450 A1 | 8/2014 | Chow et al. | |
| 2015/0111754 A1* | 4/2015 | Harris | G06N 99/002 |
| | | | 505/170 |
| 2016/0335558 A1* | 11/2016 | Bunyk | G06N 99/002 |
| 2017/0212860 A1* | 7/2017 | Naaman | G06F 13/4027 |

OTHER PUBLICATIONS

Chen, Yu, et al. "Qubit architecture with high coherence and fast tunable coupling." *Physical review letters* 113.22 (2014): 220502.
Written Opinion & International Search Report for corresponding PCT/US2016/067827 dated Mar. 21, 2017.

\* cited by examiner

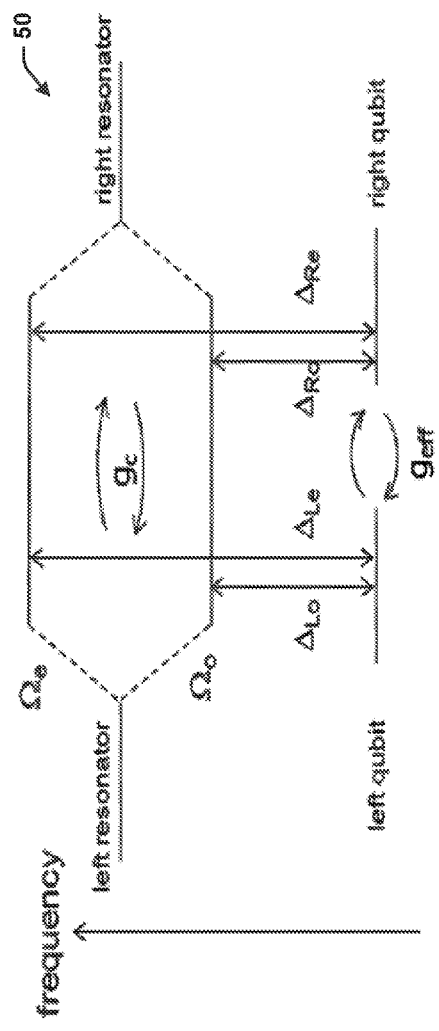
FIG. 4
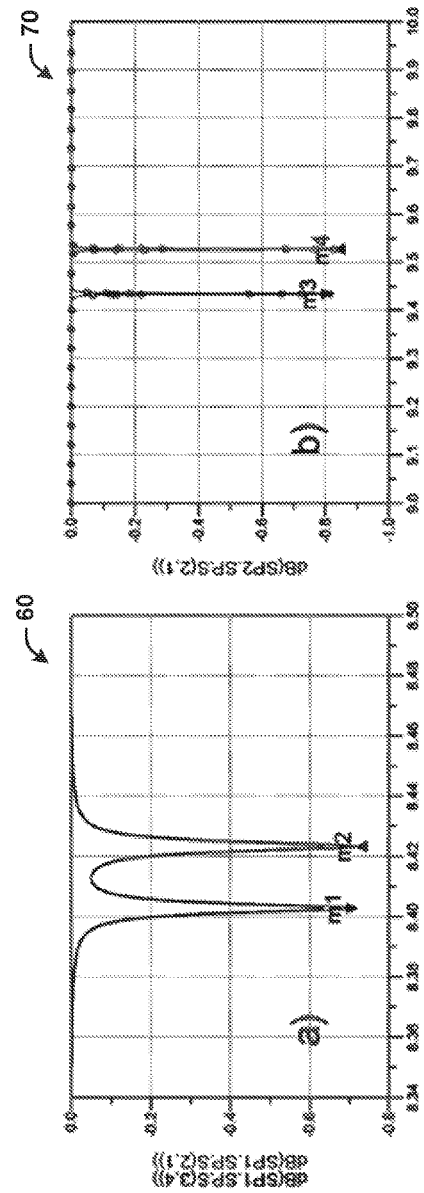
FIG. 5
FIG. 6

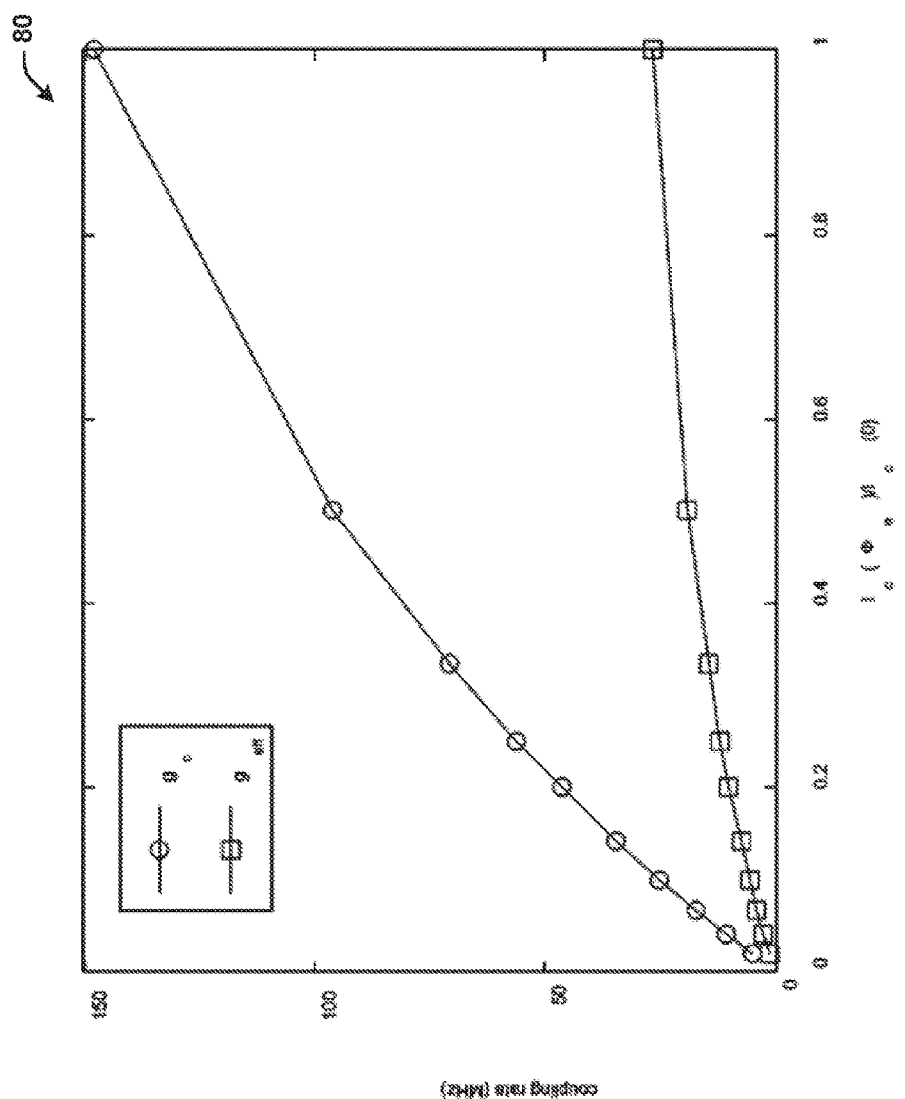

TUNABLE BUS-MEDIATED COUPLING BETWEEN REMOTE QUBITS

This invention was made with Government support under Contract No. 30059298. The Government has certain rights in this invention.

TECHNICAL FIELD

The present invention relates generally to superconducting circuits, and more particularly to tunable bus-mediated coupling between remote qubits.

BACKGROUND

The fundamental challenge for quantum computation and simulation is to construct a large-scale system of highly connected coherent qubits to perform various operations. Superconducting qubits utilize macroscopic circuits to process quantum information and are a promising candidate towards this end. Recently, materials research and circuit optimization has led to significant progress in qubit coherence. Superconducting qubits can now perform hundreds of operations within their coherence times, allowing for research into complex algorithms such as error correction. In many applications, it is desirable to combine these high-coherence qubits with tunable inter-qubit coupling, since it would allow for both coherent local operations and dynamically varying qubit interactions. For quantum computation, this would provide isolation for single-qubit gates while at the same time enabling fast two-qubit gates that minimize errors from decoherence. Despite previous attempts at tunable coupling, these applications have yet to be realized due to the challenge of incorporating tunable, long-distance coupling with high coherence devices.

SUMMARY

In one example, a tunable bus-mediated coupling system is provided that includes a first input port coupled to a first end of a variable inductance coupling element through a first resonator and a second input port coupled to a second end of the variable inductance coupling element through a second resonator. The first input port is configured to be coupled to a first qubit, and the second output port is configured to be coupled to a second qubit. A controller is configured to control the inductance of the variable inductance coupling element between a low inductance state to provide strong coupling between the first qubit and the second qubit and a high inductance state to provide isolation between the first qubit and the second qubit.

In another example, a superconducting system is provided that comprises a first qubit system having a first qubit, and a second qubit system remote from the first qubit system and having a second qubit. A tunable bus-mediated coupler is disposed between the first qubit and the second qubit. The tunable bus-mediated coupler has a first state for strongly coupling the first qubit to the second qubit and a second state for isolating the first qubit from the second qubit.

In yet a further example, a superconducting system is provided that comprises a first qubit system comprising a first qubit, a second qubit system remote from the first qubit system and comprising a second qubit, and a tunable bus-mediated coupler disposed between the first qubit and the second qubit, The tunable bus-mediated coupler comprises a first input port coupled to a first end of a Josephson junction through a first resonator and a second input port coupled to a second end of the Josephson junction through a second resonator. The first input port is coupled to the first qubit and the second output port is coupled to the second qubit. The tunable bus-mediated coupler comprises a first termination inductor coupled between the first resonator and the Josephson junction on a first end and ground on a second end, and a second termination inductor coupled between the second resonator and the Josephson junction on a first end and ground on a second end, wherein the first termination inductor, the Josephson junction and the second termination inductor form an RF-Squid. A bias inductor is inductively coupled to one of the first termination inductor and the second termination inductor, wherein an amount of current through the bias inductor controls the coupling strength between the first and the second qubit. A controller controls an amount of current through the bias inductor inductively coupled to one of the first and the second termination inductors to control the inductance of the Josephson junction between a low inductance state to provide strong coupling between the first qubit and the second qubit and a high inductance state to provide isolation between the first qubit and the second qubit.

BRIEF DESCRIPTION OF THE DRAWINGS

FIG. 4 is a schematic level diagram showing the hybridized left and right resonators of FIG. 2 producing frequency-split even and odd modes FIG. 5 illustrates a graphical panel showing results of a simulation for a particular flux setting.

FIG. 6 illustrates a graphical panel showing the frequency splitting of the even and odd bus modes due to the flux-dependent coupling.

FIG. 7 illustrates a graph of simulation results showing the dependence of the bus mode splitting and the qubit-qubit bus-mediated coupling as a function of the junction flux-dependent critical current.

DETAILED DESCRIPTION

The present disclosure relates generally to superconducting circuits, and more particularly to tunable bus-mediated coupling (or coupler) between remote qubits. In one example, a variable inductance coupling element is placed between two qubits that may reside in separate remote superconducting systems. The variable inductance coupling element can be adjusted between a strongly coupled state and a decoupled (or isolation) state between qubits in addition to various states of intermediate coupling strengths in between. In this manner, manipulation can be performed on state information of isolated qubits in a decoupled state, while this state information can be exchanged between qubits during a strongly coupled state. Furthermore, state information can be manipulated and passed between qubits without destroying the state information of the originating qubit in an intermediate coupling strength state between qubits. In one example, the variable inductance coupling element can be a Josephson junction. A variable inductance coupling element can be arranged as a single Josephson junction or series array of N Josephson junctions, each having a critical current N times larger than the original Josephson junction.

In another example, an RF-SQUID tunable coupler includes a Josephson junction embedded in the middle of a half-wave resonator bus. The RF-SQUID facilitates bus-mediated dispersive interaction between the qubits for coupling. The advantage of bus-mediated coupling is that the qubits can be physically placed remotely from each other, for example, in separate circuit blocks on the quantum processor chip. The advantage of a tunable coupler, which can essentially be turned off when desired, is a reduction in frequency crowding and unwanted residual interactions between the qubits. Furthermore, the interaction strength can be calibrated and trimmed in the field to compensate for variability in the manufacturing process, and can be controlled in real time as part of the computation protocol.

The Josephson junction can have a first inductance when no current or a low current is induced in the SQUID, and a second inductance when a current or a higher current is induced in its respective SQUID that is at a predetermined threshold that generates or induces a flux, for example, greater than about 0.1 $\Phi_0$ and less than about 0.45 $\Phi_0$, where $\Phi_0$ is equal to a flux quantum. The first inductance (e.g., $\hbar/2 e^*1/I_C$, where $\hbar$ is Planck's constant divided by $2\pi$, e is electron charge and $I_C$ is the critical current of the Josephson junction) can provide coupling between the first and second qubits. The second inductance (e.g., large inductance value) can provide decoupling between the first and second qubits.

Figure 1:
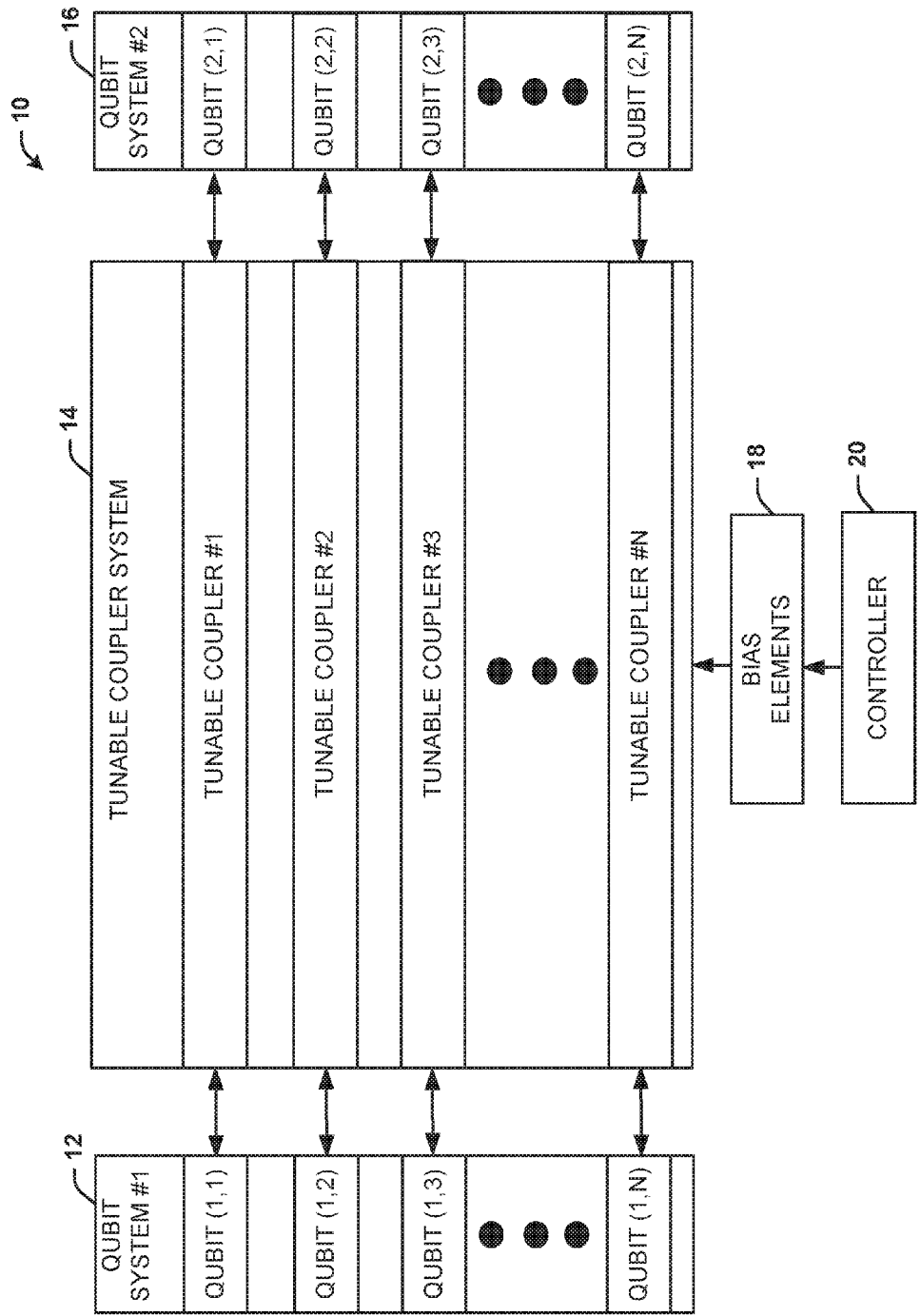
FIG. 1 illustrates a block diagram of an example of a superconducting system.

FIG. 1 illustrates a block diagram of an example of a superconducting system 10. The superconducting system includes a first qubit system 12 coupled to a second qubit system 16 through a tunable coupler system 14. The first qubit system 12 includes a plurality of qubits labeled, qubit (1,1) to qubit (1,N), and the second qubit system 16 includes a plurality of qubits labeled, qubit (2,1) to qubit (2,N), such that (X,N) provides X which represents the qubit system and N represents a qubit number within the qubit system, where N is an integer greater than or equal to one. The first qubit system 12 and the second qubit system 16 can be separate logical blocks that perform different logical operations such as different gate operations, error correction operations, memory operations, or any of a variety of other superconducting operations. The first qubit system 12 and second qubit system 16 can also include various additional qubits and other superconducting elements that are not coupled to qubits in the other qubit system, but may be coupled to other qubits in its respective system for performing a variety of qubit and other superconducting operations.

Each qubit in the first qubit system 12 is coupled to a respective qubit in the second qubit system 16 by a respective tunable coupler of the tunable coupler system 14 having N tunable couplers, labeled tunable coupler 1 through tunable coupler N. Each tunable coupler includes a variable inductance coupling element that can be adjusted to allow for control of the coupling strength between two independent qubits of the opposing qubit systems 12 and 16, respectively. The variable inductance coupling element can be disposed between two resonators to allow for remote coupling of the two independent qubits via a tunable bus-mediated coupler. In one example, the variable inductance coupling element is a Josephson junction that resides in a RF SQUID disposed between two resonators. The superconducting switching system 10 also includes a switch controller 18 and bias elements 16. The variable inductance coupling elements are controlled by magnetic flux via the bias elements 16 and the switch controller 18 to couple, decouple and to control the coupling strength of the coupling between respective independent qubits in opposing qubit systems 12 and 16.

Figure 2:
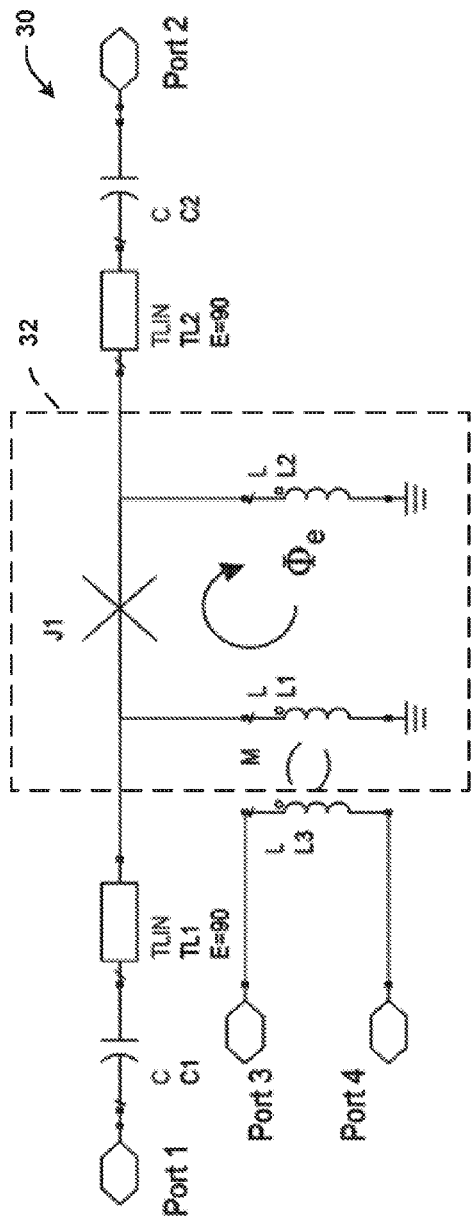
FIG. 2 illustrates a schematic of an example of a tunable bus-mediated coupler that could be employed in FIG. 1.

FIG. 2 illustrates a schematic of an example of a tunable bus-mediated coupler 30 that could be employed in FIG. 1. The tunable bus-mediated coupler 30 is composed of a first quarter-wave transmission line resonator TL1 and a second quarter-wave transmission line resonator TL2. A first coupling capacitor C1 couples a first port (Port 1) to a first end of the first quarter-wave transmission line resonator TL1, and a second coupling capacitor C2 couples a second port (Port 2) to a first end of the second quarter-wave transmission line resonator TL2. The first port (Port 1) can be coupled to a first qubit and the second port (Port 2) can be coupled to a second qubit. A second end of the first quarter-wave transmission line resonator TL1 is shorted to ground via a first terminating inductor (L1) and a second end of the second quarter-wave transmission line resonator TL2 is shorted to ground via a second terminating inductor L2. A Josephson junction (J1) is further connected between the termination inductors L1 and L2, so that the Josephson junction J1 together with termination inductors L1 and L2, form an RF-SQUID 32.

The RF-SQUID 32 functions as a variable transformer, controlled by a magnetic flux $\Phi_e$ induced in the RF-SQUID loop via a mutual inductance M induced by a current flowing between a third port (Port 3) and a fourth port (Port 4) through a bias inductance L3. When the flux enclosed in the RF-SQUID 32, $\Phi_e$, is an appreciable fraction of $\Phi_0/2$, as determined by the ratio of the Josephson junction J1 to linear inductances L1 and L2 in the RF-SQUID 32, the effective mutual coupling between the two resonators TL1 and TL2 is essentially zero. When the enclosed flux is close to zero or an integer multiple of $\Phi_0$, the effective mutual coupling between the resonators TL1 and TL2 is appreciable, and equals to $M_{eff}=L_1*L_2/(L_{J1}+L_1+L_2)$. Close to an enclosed flux of $\Phi_0/2$, the effective mutual coupling is appreciable and negative. Therefore, the effective mutual coupling $M_{eff}$ ($\Phi_e$) between the two resonators TL1 and TL2 is a function of the applied flux. The flux can be varied between zero and $\Phi_0/2$ by changing the current through bias inductance L3 to provide varying strengths of the effective coupling between the first and second qubits coupled to the first port (Port 1) and the second port (Port 2), respectively.

Figure 3:
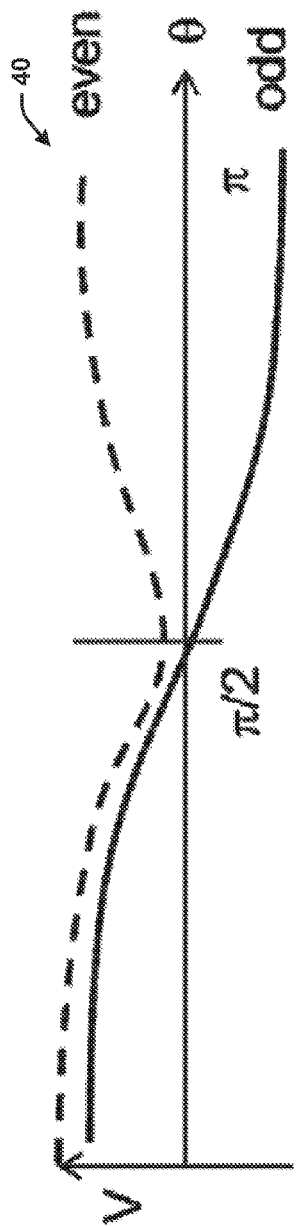
FIG. 3 illustrates a graph of the voltage along the length of combined coupled-resonator system showing the even (dashed) and odd (solid) modes of oscillation.

FIG. 3 illustrates a graph 40 of the voltage along the length of combined coupled-resonator of FIG. 2 showing the even (dashed) and odd (solid) modes of oscillation. Because of the coupling between the two transmission line resonators TL1 and TL2, the combined system exhibit two oscillating eigen-modes having different frequencies. A first odd mode having a frequency $\Omega_o$ close to the half-wave frequency of the combined system, and in which the voltages at the ends of the transmission lines oscillate 180 degrees out of phase, and an even mode having a different frequency $\Omega_e$ in which the voltages at the ends of the transmission lines oscillate in phase. When the coupling is positive, the even mode frequency is greater than the odd mode frequency. When the coupling is negative, the even mode frequency is lower than the odd mode. In either case the even and odd modes are split in frequency by an amount $2 g_c$, proportional to the effective mutual $M_{eff}(\Phi_e)$.

Qubits that are connected to the two ports of the coupled-resonator bus via capacitors C1 and C2 of FIG. 2, each interact with both even and odd modes of the bus. In the dispersive regime, when the qubit frequencies are sufficiently detuned from the bus frequencies, an effective bus-mediated interaction between the qubits exists. However, the sign of the mediated interaction due to the even mode is opposite to that of the interaction due to the odd mode, and therefore the total effective mediated coupling can be determined as a balance of the coupling due to the two bus modes. In particular, the two contributions can be made equal in magnitude and opposite in sign, resulting in a cancellation of the coupling. FIG. 4 is a schematic level diagram 50, showing the hybridized left and right resonators producing the frequency-split even and odd modes, and the left and right qubits each at a respective detuning $\Delta_{L,Ro}$ from the odd mode, and $\Delta_{L,Re}$ from the even mode.

The overall bus-mediated coupling between the qubits in the dispersive regime, $g_{eff}$, as a function of the detuning is given by:

$$g_{eff} = \frac{g_L g_R}{2}\left(\frac{1}{\Delta_{Le}} + \frac{1}{\Delta_{Re}} - \frac{1}{\Delta_{Lo}} - \frac{1}{\Delta_{Ro}}\right) \quad \text{EQUATION 1}$$

where $g_{L,R}$ are the fixed coupling strengths of the qubit to the respective resonators via capacitors C1 and C2 in FIG. 2. When the frequencies of the two qubits are equal so that $\Delta_{Le}=\Delta_{Re}=\Delta_e$ and $\Delta_{Lo}=\Delta_{Ro}=\Delta_o$, the expression for the effective bus-mediated qubit-qubit coupling simplifies to:

$$g_{eff} = g_L g_R\left(\frac{2g_c}{\Delta_e \Delta_o}\right) \quad \text{EQUATION 2}$$

where $g_{eff}$ is dependent on the flux $\Phi_e$ via $g_c$ and, implicitly, via $\Delta_e$ and $\Delta_o$, which are all flux-dependent.

An Agilent's Advanced Design Simulation (ADS) tool simulation was performed with the junction approximated with a linear inductor whose value was changed from the nominal zero-current Josephson inductance up to a value 50 times greater. The results of the simulation for a particular flux setting are shown in a panel 60 of FIG. 5 showing the splitting in the qubit spectrum due to the effective interaction $g_{eff}$, and a panel 70 of FIG. 6 showing the frequency splitting of the even and odd bus modes due to the flux-dependent coupling $g_c$. The simulations confirm the functional dependence of $g_{eff}$ on $g_c$, and confirm the expected dependence of $g_c$ on the flux-tunable inductance of the Josephson junction.

FIG. 7 illustrates a graph 80 of simulation results showing the dependence of the bus mode splitting $g_c$ and the qubit-qubit bus-mediated coupling $g_{eff}$ as a function of the junction flux-dependent critical current for a certain value of the qubit-bus frequency detuning. While in the examples shown, the bus frequency is higher than the qubit frequencies, the same behavior is replicated when the bus frequency is lower than the qubit frequencies.

To summarize, an RF-SQUID tunable coupler embedded between two quarter wave resonators such that the combined system forms a quantum bus having two modes that contribute with opposite signs to a mediated qubit-qubit interaction. The total effective interaction between the qubits is thus tunable with flux as a balance between the contributions to the mediated coupling from the two bus modes. The advantage of a tunable coupling, which can essentially be turned off when desired, is a reduction in frequency crowding and unwanted residual interactions between the qubits. Furthermore, the interaction strength can be calibrated and trimmed in the field to compensate for variability in the manufacturing process, and can be controlled in real time as part of the computation protocol.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An RF-SQUID tunable bus-mediated coupling system comprising:
   a first port coupled to a first end of a variable inductance coupling element through a first quarter-wave transmission line resonator, the first port being configured to be coupled to a first qubit;
   a second port coupled to a second end of the variable inductance coupling element through a second quarter-wave transmission line resonator, the second port being configured to be coupled to a second qubit; and
   a controller configured to control the inductance of the variable inductance coupling element between a low inductance state to provide strong coupling between the first qubit and the second qubit and a high inductance state to provide isolation between the first qubit and the second qubit,
   wherein the variable inductance coupling element comprises at least one Josephson junction, wherein the first and second resonators compose a half-wave resonator bus, and wherein the at least one Josephson junction is embedded in the middle of the half-wave resonator bus.

2. The system of claim 1, wherein the variable inductance coupling element comprises a series array of N Josephson junctions, each having a critical current N times larger than a single Josephson junction.

3. The system of claim 1, wherein the variable inductance coupling element is a single Josephson junction.

4. The system of claim 3, further comprising a first termination inductor coupled between the first resonator and the Josephson junction on a first end and ground on a second end, and a second termination inductor coupled between the second resonator and the Josephson junction on a first end and ground on a second end, wherein the first termination inductor, the Josephson junction and the second termination inductor form an RF-SQUID.

5. The system of claim 4, further comprising a bias inductor inductively coupled to one of the first termination inductor and the second termination inductor, wherein an amount of current through the bias inductor controls the coupling strength between the first and the second qubit.

6. The system of claim 4, further comprising a first coupling capacitor coupled between the first port and the first resonator, and a second coupling capacitor coupled between the second port and the second resonator.

7. The system of claim 5, wherein the controller controls an amount of current through the bias inductor inductively coupled to one of the first and the second termination inductors.

8. The system of claim 7, wherein the controller provides a current through the bias inductor between no current that induces no net flux in the RF-SQUID allowing for coupling between the first and second qubits and a current that induces a net flux in the RF-SQUID of 0.1 $\Phi_0$ to 0.45 $\Phi_0$, where $\Phi_0$ is equal to a flux quantum, providing isolation between the first and second qubits.

9. A superconducting system comprising the tunable bus-mediated coupling system of claim 1, the superconducting system comprising a first qubit system comprising the first qubit, and a second qubit system remote from the first qubit system and comprising the second qubit, wherein the tunable bus-mediated coupling system is arranged to couple and decouple the first qubit and second qubit.

10. A superconducting system comprising:
a first qubit system comprising a first qubit;
a second qubit system remote from the first qubit system and comprising a second qubit; and
an RF-SQUID tunable bus-mediated coupler disposed between the first qubit and the second qubit and connected to the first and second qubits by respective first and second quarter-wave transmission line resonators, the first and second resonators composing a half-wave resonator bus, the tunable bus-mediated coupler having a first state for strongly coupling the first qubit to the second qubit and a second state for isolating the first qubit from the second qubit, wherein the coupler comprises a variable inductance coupling element comprising at least one Josephson junction embedded in the middle of the half-wave resonator bus.

11. The system of claim 10, wherein the variable inductance coupling element comprises a series array of N Josephson junctions, each having a critical current N times larger than a single Josephson junction.

12. The system of claim 11, further comprising a controller configured to control the inductance of the variable inductance coupling element between a low inductance state to provide strong coupling between the first qubit and the second qubit and a high inductance state to provide isolation between the first qubit and the second qubit.

13. The system of claim 11, wherein the variable inductance coupling element is a single Josephson junction.

14. The system of claim 13, further comprising a first termination inductor coupled between the first resonator and the Josephson junction on a first end and ground on a second end, and a second termination inductor coupled between the second resonator and the Josephson junction on a first end and ground on a second end, wherein the first termination inductor, the Josephson junction and the second termination inductor form an RF-SQUID.

15. The system of claim 14, further comprising a bias inductor inductively coupled to one of the first termination inductor and the second termination inductor, wherein an amount of current through the bias inductor controls the coupling strength between the first and the second qubit.

16. The system of claim 15, further comprising a first coupling capacitor coupled between the first qubit and the first resonator, and a second coupling capacitor coupled between the second resonator and the second qubit.

17. The system of claim 15, wherein the controller provides a current through the bias inductor between no current that induces no net flux in the RF-SQUID allowing for coupling between the first and second qubits and a current that induces a net flux in the RF-SQUID of 0.1 $\Phi_0$ to 0.45 $\Phi_0$, where $\Phi_0$ is equal to a flux quantum, providing isolation between the first and second qubits.

18. A superconducting system comprising:
a first qubit system comprising a first qubit;
a second qubit system remote from the first qubit system and comprising a second qubit; and
an RF-SQUID tunable bus-mediated coupler disposed between the first qubit and the second qubit, the tunable bus-mediated coupler comprising:
a first port coupled to a first end of a Josephson junction through a first quarter-wave transmission line resonator, the first port being coupled to the first qubit;
a second port coupled to a second end of the Josephson junction through a second quarter-wave transmission line resonator, the second port being coupled to the second qubit, the first and second resonators composing a half-wave resonator bus, wherein the Josephson junction is embedded in the middle of the half-wave resonator bus;
a first termination inductor coupled between the first resonator and the Josephson junction on a first end and ground on a second end, and
a second termination inductor coupled between the second resonator and the Josephson junction on a first end and ground on a second end, wherein the first termination inductor, the Josephson junction and the second termination inductor form an RF-SQUID;
a bias inductor inductively coupled to one of the first termination inductor and the second termination inductor, wherein an amount of current through the bias inductor controls the coupling strength between the first and the second qubit; and
a controller that controls an amount of current through the bias inductor inductively coupled to one of the first and the second termination inductors to control the inductance of the Josephson junction between a low inductance state to provide strong coupling between the first qubit and the second qubit and a high inductance state to provide isolation between the first qubit and the second qubit.

19. The system of claim 18, further comprising a first coupling capacitor coupled between the first qubit and the first resonator, and a second coupling capacitor coupled between the second resonator and the second qubit.

20. The system of claim 18, wherein the controller provides a current through the bias inductor between no current that induces no net flux in the RF-SQUID allowing for coupling between the first and second qubits and a current that induces a net flux in the RF-SQUID of 0.1 $\Phi_0$ to 0.45 $\Phi_0$, where $\Phi_0$ is equal to a flux quantum, providing isolation between the first and second qubits.

* * * * *